(12) United States Patent
MacKinnon et al.

(10) Patent No.: US 10,295,145 B2
(45) Date of Patent: *May 21, 2019

(54) TOP-EMISSION VCSEL-ARRAY WITH INTEGRATED DIFFUSER

(71) Applicant: APPLE INC., Cupertino, CA (US)

(72) Inventors: Neil MacKinnon, San Jose, CA (US); Weiping Li, Pleasanton, CA (US); Xiaofeng Fan, San Jose, CA (US)

(73) Assignee: APPLE INC., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/055,104

(22) Filed: Aug. 5, 2018

(65) Prior Publication Data

US 2019/0017678 A1 Jan. 17, 2019

Related U.S. Application Data

(63) Continuation of application No. 15/190,211, filed on Jun. 23, 2016, now Pat. No. 10,072,815.

(51) Int. Cl.
| | |
|---|---|
| *F21V 27/00* | (2006.01) |
| *F21V 3/04* | (2018.01) |
| *H01S 5/183* | (2006.01) |
| *H01S 5/42* | (2006.01) |
| *H01S 5/00* | (2006.01) |
| *F21Y 115/30* | (2016.01) |

(52) U.S. Cl.
CPC ............. *F21V 3/049* (2013.01); *H01S 5/005* (2013.01); *H01S 5/18386* (2013.01); *H01S 5/18388* (2013.01); *H01S 5/18391* (2013.01); *H01S 5/423* (2013.01); *F21Y 2115/30* (2016.08)

(58) Field of Classification Search
CPC ........... H01L 33/405; H01L 2924/0002; H01L 2933/0016; H01L 5/0244; H01L 5/0425; H01L 5/105; H01L 5/18308; H01L 33/007; H01L 33/387; H01L 33/45
See application file for complete search history.

(56) References Cited

U.S. PATENT DOCUMENTS

| | | | |
|---|---|---|---|
| 8,783,893 B1 * | 7/2014 | Seurin .................... | H01S 5/4018 362/157 |
| 9,048,633 B2 * | 6/2015 | Gronenborn ....... | B23K 26/0608 |
| 10,072,815 B2 * | 9/2018 | MacKinnon ............ | F21V 3/049 |
| 2002/0048292 A1 * | 4/2002 | Bissinger ................ | G02B 27/09 372/29.02 |
| 2003/0026310 A1 * | 2/2003 | Valliath ............. | G02F 1/133603 372/50.1 |
| 2007/0071056 A1 * | 3/2007 | Chen ..................... | G01S 7/4814 372/50.124 |

* cited by examiner

*Primary Examiner* — Ali Alavi

(74) *Attorney, Agent, or Firm* — Kliger & Associates

(57) ABSTRACT

A radiation source includes a semiconductor substrate, an array of vertical-cavity surface-emitting lasers (VCSELs) formed on the substrate, which are configured to emit optical radiation, and a transparent crystalline layer formed over the array of VCSELs. The transparent crystalline layer has an outer surface configured to diffuse the radiation emitted by the VCSELs.

13 Claims, 4 Drawing Sheets

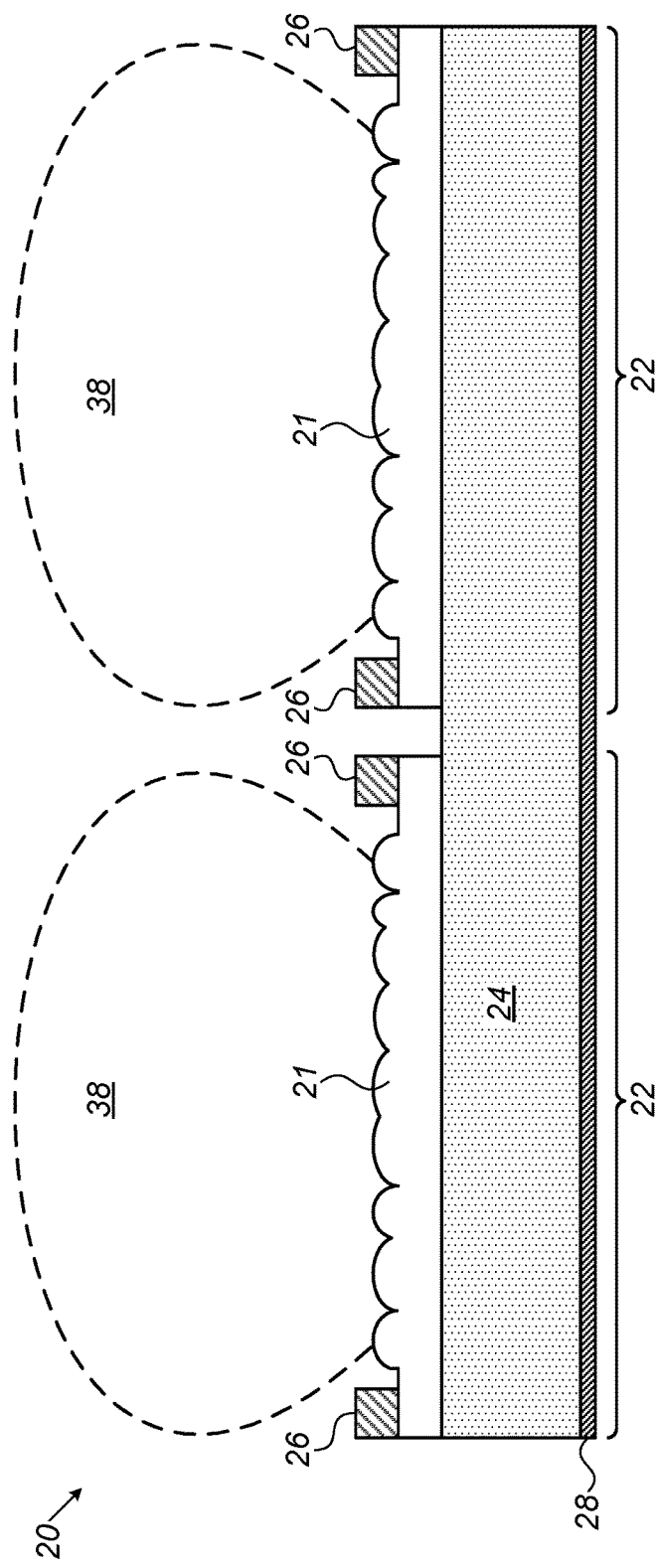

TOP-EMISSION VCSEL-ARRAY WITH INTEGRATED DIFFUSER

FIELD OF THE INVENTION

The present invention relates generally to semiconductor devices, and particularly to optoelectronic devices and their manufacture.

BACKGROUND

High-power VCSEL-arrays (vertical-cavity surface-emitting laser arrays) are excellent candidates for illumination applications as compared to LEDs (light-emitting diodes): The spectral width of VCSELs is narrower than that of LEDs (1-2 nm vs. a few tens of nm), and the efficiency of VCSELs is higher than that of LEDs (30% vs. 10%). In some applications, it is advantageous to diffuse the light emitted by a VCSEL.

SUMMARY

Embodiments of the present invention that are described hereinbelow provide improved VCSEL-arrays.

There is therefore provided, in accordance with an embodiment of the present invention, a radiation source, including a semiconductor substrate, an array of vertical-cavity surface-emitting lasers (VCSELs) formed on the substrate, which are configured to emit optical radiation, and a crystalline layer, for example a transparent layer, formed over the array of VCSELs and having an outer surface configured to diffuse the radiation emitted by the VCSELs.

In a disclosed embodiment, the outer surface of the transparent crystalline layer of the radiation source is patterned to define microlenses having different, respective optical powers. Additionally or alternatively, the microlenses are arrayed in an irregular pattern over the VCSELs.

In another embodiment, the outer surface of the transparent crystalline layer of the radiation source is randomly roughened.

In some embodiments, the transparent crystalline layer includes an epitaxial layer of a semiconductor material. In one such embodiment, the radiation source includes anode contacts electrically connected to the VCSELs through the transparent crystalline layer.

Alternatively, the transparent crystalline layer includes a dielectric material.

There is also provided, in accordance with an embodiment of the present invention, a method for producing a radiation source. The method includes forming an array of vertical-cavity surface-emitting lasers (VCSELs) on a semiconductor substrate, forming a crystalline layer over the VCSEL array, and etching the outer surface of the transparent epitaxial layer so as to create a surface structure that diffuses the optical radiation emitted by the VCSELs.

In a disclosed embodiment, etching the outer surface includes forming microlenses having different, respective optical powers. Additionally or alternatively, the microlenses are arrayed in an irregular pattern over the VCSELs.

In some embodiments, forming the microlenses includes depositing a photoresist layer over the transparent crystalline layer, photolithographically patterning the photoresist layer so as to define precursors for microlenses, baking the patterned photoresist layer so as to cause the precursors to reflow into rounded shapes, transferring the rounded shapes into the transparent crystalline layer by etching so as to form microlenses, and removing the remaining photoresist.

In other embodiments, etching the outer surface includes randomly roughening the outer surface.

There is additionally provided, in accordance with an embodiment of the invention, a radiation source, including a semiconductor substrate and one or more vertical-cavity surface-emitting lasers (VCSELs) formed on the substrate, which are configured to emit optical radiation. A diffusing layer, which may comprise a crystalline or an amorphous material, is formed over each VCSEL, configured to diffuse the radiation emitted by the VCSEL. Anode electrodes of the VCSEL are formed over the diffusing layer.

The present invention will be more fully understood from the following detailed description of the embodiments thereof, taken together with the drawings in which:

BRIEF DESCRIPTION OF THE DRAWINGS

FIG. 1 is a schematic illustration of a VCSEL-array with an integrated diffuser, in accordance with an embodiment of the invention;

DETAILED DESCRIPTION OF EMBODIMENTS

Figure 2A:
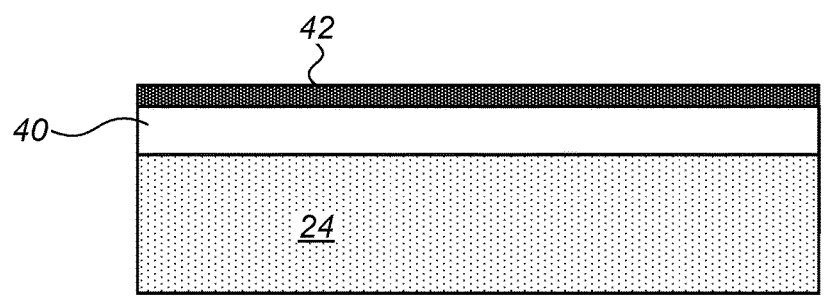
FIGS. 2A-D are schematic sectional views of a VCSEL-array with an integrated diffuser in successive stages of manufacture, in accordance with an embodiment of the invention.

VCSEL-arrays that are known in the art typically comprise anywhere from a few to hundreds of individual VCSELs, built with standard epitaxial techniques on a GaAs or other semiconductor substrate. The angular beam divergence of a VCSEL-array is typically 10-25°, determined by the beam divergence of the individual VCSELs. In several applications of VCSEL-arrays it is advantageous to increase the angular beam divergence beyond that provided by the array itself.

Embodiments of the present invention that are described herein provide cost-effective methods for increasing the angular beam divergence, as well as arrays of VCSELs implementing such methods. The methods are based on integrating a diffuser onto the top surface of the VCSEL-array by a direct extension of the manufacturing process of the VCSEL-array itself. Two specific embodiments are described hereinbelow. Although the description below relates to VCSEL arrays, the principles of the disclosed embodiments can also be applied, mutatis mutandis, to individual VCSELs.

The first embodiment comprises forming an array of microlenses in a transparent crystalline layer, deposited over the VCSEL-array using either a liquid or vapor deposition. The crystalline layer is "transparent" in the sense that the absorption of the layer at the lasing wavelength of the VCSEL-array does not exceed 20%. The transparent crystalline layer may be either an epitaxial or a polycrystalline layer. An epitaxial layer is grown over the VCSEL epitaxy layers as part of the full VCSEL fabrication process. In some embodiments, this epitaxial layer matches (i.e., is the same as or closely similar to) one of the VCSEL epitaxy layers, such as a GaAs or AlGaAs layer grown over a GaAs-based VCSEL, for example. Due to lattice matching, the stress imposed on the VCSEL epitaxy layers by this additional layer is minimized, and the high refractive index of these materials is advantageous in terms of the diffusing properties. The material and/or doping level of the added epitaxial layer are chosen to possess sufficient transparency at the emission wavelength of the VCSEL.

For a non-epitaxial deposition, a dielectric material may be deposited over the VCSEL-array after the full VCSEL fabrication process has been completed. Dielectric materials are typically transparent over a broader spectral range than semiconductor materials, and allow for a more flexible processing sequence. These materials comprise, for example, certain polymers and dielectrics such as silicon dioxide or silicon nitride. Due to the lower refractive index, more aggressive surface profiles may be used in order to achieve the same diffusing effect as with epitaxial layers, and dielectric layers may also cause a higher stress on the VCSEL epitaxy layers. Polycrystalline silicon (poly-Si) may be used, for example, for longer wavelengths, such as 1550 nm.

In either case, the physical shapes (for example, height and/or curvature) and locations of the individual microlenses are designed to diffuse the beams of the individual emitters. By increasing the overall beam divergence of individual emitters and/or changing the directions of the beams, the array of microlenses produces as a collective result an output beam with angularly uniform emission, and with much larger divergence than the native divergence of a VCSEL. The microlens array is manufactured using photolithographic methods, as will be detailed below.

The second embodiment comprises depositing over the VCSEL-array an transparent crystalline layer (as described in the first embodiment), and subsequently etching the surface of the layer using a dry or wet etch process. The etch produces a randomly rough top surface, which diffuses each of the beams emitted by the individual VCSELs of the array, again producing a uniform beam with much larger divergence than the native divergence of a VCSEL.

FIG. 1 is a schematic illustration of a VCSEL-array 20, formed in VCSEL epitaxy layers 24, with integrated microlens arrays 21, in accordance with an embodiment of the invention. VCSEL-array 20 comprises individual VCSELs 22 (two are shown). VCSEL-array 20 is manufactured using epitaxial methods based on VCSEL designs and manufacturing methods that are known in the art (the details of the VCSEL epitaxy layers 24 are not shown). Each VCSEL 22 is connected electrically to a respective anode contact 26 and either to a common cathode contact 28 or to separate cathode contacts (not shown).

Integrated microlens array 21 has been configured to diffuse the beams (not shown) emitted by VCSELs 22 into diffuse radiation patterns 38. When microlens array 21 is formed epitaxially in a material such as GaAs or AlGaAs, the requirement for transparency of the array for VCSEL 22 spectrum restricts the doping of the layer, and consequently may lower the electrical conductance. In this case, electrical connectivity of anodes 26 to VCSEL epitaxy layers 24 can be strengthened either by local implantation before forming anodes 26, or by opening windows in microlens array 21. When microlens array 21 is made of dielectric material, anodes 26 will have been formed over VCSEL epitaxy layers 24 before depositing the dielectric material over VCSELs 22.

In another embodiment of the invention, a randomly rough top surface (not shown) of the transparent crystalline layer is used to diffuse the beams from VCSELs 22. The same considerations for connectivity of anodes 26 to VCSEL epitaxy layers 24 are valid as in the embodiment using microlens array 21 that is described above.

FIGS. 2A-D are schematic illustrations of the successive stages of manufacture for an integrated diffusing microlens array on top of VCSEL epitaxy layers 24, in accordance with an embodiment of the invention.

FIG. 2A is a schematic illustration showing a transparent crystalline layer 40 and an unpatterned photoresist layer 42, successively deposited over VCSEL epitaxy layers 24. Transparent crystalline layer 40 is a planar layer, which will be patterned into a microlens array during the process. When transparent crystalline layer 40 is made of dielectric material, anodes 26 will have been formed on VCSEL epitaxy layers 24 before depositing transparent crystalline layer 40 (anodes 26 not shown in FIGS. 2A-D).

Figure 2B:
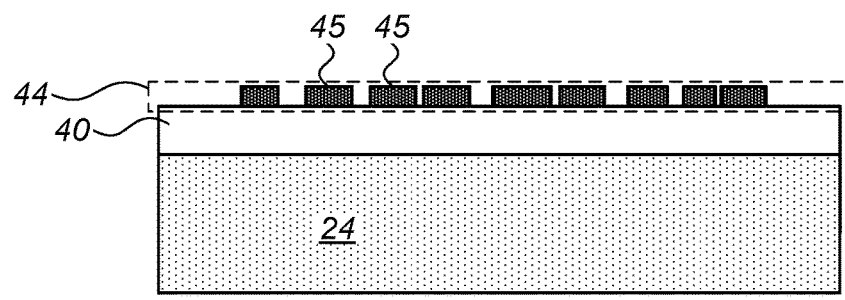

FIG. 2B is a schematic illustration showing the result of patterning unpatterned photoresist layer 42 (FIG. 2A) into a patterned photoresist layer 44, using photolithographic techniques. This patterning forms precursors 45 for the microlenses that will be etched subsequently in the process. The pattern of precursors is irregular and may be either aligned or not aligned with the pattern of VCSELs 22 in the VCSEL-array. The sizes of precursors may also be non-uniform, so that the resulting microlenses will have different, respective optical powers. The patterning also prepares positions for forming anode 26 adjacent to the emitting area of VCSEL 22 (for example, for a ring-shaped anode around the emitting area). Transparent crystalline layer 40 is still unchanged under patterned photoresist layer 44. This sort of patterning and positioning of the anodes over the diffusing layer can also be useful with other sorts of diffusers, such as diffusing layers made of amorphous materials, and with single VCSELs, as well as arrays.

Figure 2C:
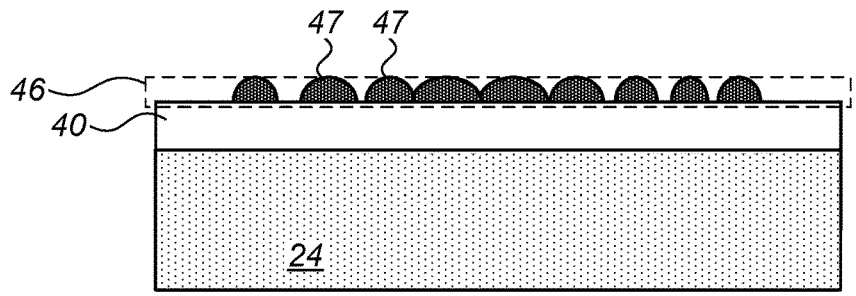

FIG. 2C is a schematic illustration of a photoresist profile 46 after reflow baking rounds precursors 45 (FIG. 2B) into rounded shapes 47. The photoresist can be positive or negative photoresist with reflow capability. Typical reflow bake temperature is from 100 to 250° C. and typical duration is from seconds to tens of minutes. Transparent crystalline layer 40 is still planar at this stage.

Figure 2D:
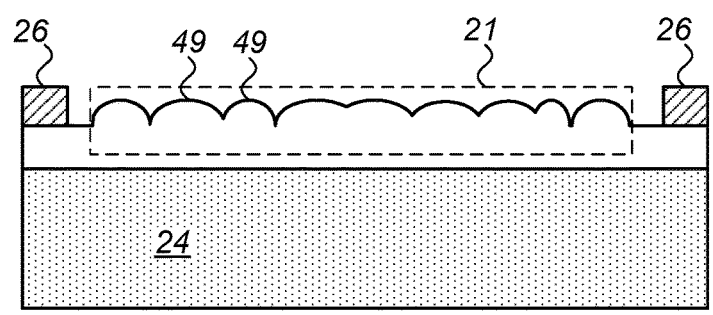

FIG. 2D is a schematic illustration of a microlens array 21, which has been formed by etching photoresist profile 46 by a suitable etch, such as a plasma etch, and thus transferring rounded shapes 47 into transparent crystalline layer 40 (FIG. 2C). Any residual photoresist remaining after etching has been removed. As a result of the pattern applied in FIG. 2B, individual microlenses 49 in microlens array 21 are arrayed in an irregular pattern on top of each VCSEL 22. The irregular pattern of microlenses 49 may be either a random or non-random pattern, configured to shift the directions of the beams emitted by each VCSEL 22 as well as increase their angles of divergence, either in a random or non-random manner, for a uniform fill of diffuse radiation patterns 38 (FIG. 1). Additionally or alternatively, the microlenses have different, respective optical powers.

After microlens array 21 has been formed in an epitaxial semiconductor layer as described above, anode contacts 26 are formed above the microlens array in the positions prepared for in the patterning stage described in the context of FIG. 2B, and the full VCSEL manufacturing process is completed, resulting in VCSEL-array 20 (FIG. 1). In the alternative case wherein microlens array 21 is formed in a dielectric material, the deposition of transparent crystalline layer 40 and the forming of microlens array 21 take place after completion of the VCSEL manufacturing process (except for subsequent wafer thinning and backside cathode deposition). As previously described (FIG. 1), openings are patterned and etched in microlens array 21 for gaining access to anodes 26, which have been buried under transparent crystalline layer 40 in the process.

Figure 3A:
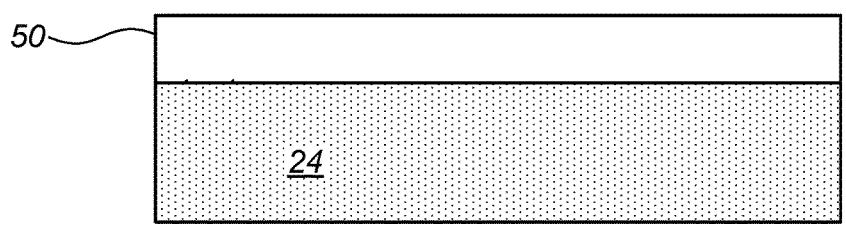
FIGS. 3A-B are schematic sectional views of a VCSEL-array with an integrated diffuser in successive stages of manufacture, in accordance with another embodiment of the invention.
Figure 3B:
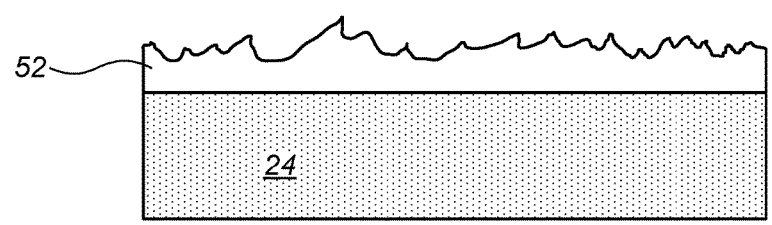

FIGS. 3A-B are schematic illustrations of the successive stages of manufacture of a randomly rough diffusing surface on top of VCSEL epitaxy layers 24, in accordance with another embodiment of the invention.

FIG. 3A is a schematic illustration showing a transparent crystalline layer 50 deposited over VCSEL epitaxy layers 24. Transparent crystalline layer 50 is a planar layer, which will become a diffuser in the next stage. It may have different material properties from transparent crystalline layer 40 of FIG. 2A due to the process requirements of the disclosed embodiment. Materials with local non-uniformities due to either material composition or crystal grain structure are advantageous in creating the non-uniform etch in the process step illustrated in FIG. 3B.

FIG. 3B is a schematic illustration showing diffuser layer 52, formed from transparent crystalline layer 50 (FIG. 3A) by an etch process. The material of transparent crystalline layer 50, as well as the process parameters of the etch, which may be a dry or a wet etch, have been selected so as to give diffuser layer 52 a randomly rough top surface 54. The random roughness of top surface 54 is generated either by the etchant itself, or by the non-uniformity of the material of transparent layer 50, or by a combination of the two properties. (When using a uniform etching process, such as a wet etch, the random roughness of top surface 54 is typically a result of non-uniformity of transparent crystalline layer 50.) The impact of the random roughness on the beams emitted by individual VCSELs 22 is to diffuse each beam to a larger angle of divergence as well as to change randomly the direction of the beam, thus producing diffuse radiation pattern 38 (FIG. 1).

Similarly to the embodiment using microlens arrays 21, in the case wherein diffuser layer 52 is made in dielectric material, anodes 26 will have been formed on VCSEL epitaxy layers 24 before depositing transparent crystalline layer 50, and windows will be opened in diffuser layer 52 for gaining access to anodes 26 (not shown).

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A radiation source, comprising:
    a semiconductor substrate;
    an array of vertical-cavity surface-emitting lasers (VCSELs) formed on the substrate, which are configured to emit optical radiation; and
    a crystalline layer formed over the array of VCSELs and having an outer surface patterned to define microlenses arrayed in an irregular pattern and having different, respective optical powers so as to diffuse the radiation emitted by the VCSELs.

2. The radiation source according to claim 1, wherein the crystalline layer is transparent.

3. The radiation source according to claim 1, wherein the outer surface of the crystalline layer is randomly roughened.

4. The radiation source according to claim 1, wherein the crystalline layer comprises an epitaxial layer of a semiconductor material.

5. The radiation source according to claim 4, wherein the array of VCSELs comprises multiple epitaxial layers formed on the substrate, and wherein the epitaxial layer of the semiconductor material matches one of the epitaxial layers of the VCSELs.

6. The radiation source according to claim 4, and comprising anode contacts electrically connected to the VCSELs through the crystalline layer.

7. The radiation source according to claim 1, wherein the crystalline layer comprises a dielectric material.

8. A method of manufacturing a radiation source, the method comprising:
    forming an array of vertical-cavity surface-emitting lasers (VCSELs) on a semiconductor substrate;
    forming a crystalline layer over the VCSEL array; and
    etching an outer surface of the crystalline layer to create a surface structure that comprises microlenses arrayed in an irregular pattern and having different, respective optical powers and thereby diffuses optical radiation emitted by the VCSELs.

9. The method according to claim 8, wherein etching the outer surface comprises:
    forming a photoresist layer over the crystalline layer;
    photolithographically patterning the photoresist layer so as to define precursors for microlenses;
    baking the patterned photoresist layer so as to cause the precursors to reflow into rounded shapes;
    transferring the rounded shapes into the crystalline layer by etching so as to form the microlenses in the crystalline layer; and
    removing the photoresist remaining on the etched crystalline layer.

10. The method according to claim 8, wherein etching the outer surface comprises randomly roughening the outer surface by etching.

11. The method according to claim 8, wherein the crystalline layer comprises an epitaxial layer of a semiconductor material.

12. The method according to claim 11, and comprising forming anode contacts for the VCSELs over the crystalline layer.

13. The method according to claim 8, wherein the crystalline layer comprises a dielectric material.

* * * * *